United States Patent
Yeh

(10) Patent No.: US 8,257,098 B2
(45) Date of Patent: Sep. 4, 2012

(54) SOCKET CONNECTOR CAPABLE OF PREVENTING MISMATCH OF PICK-UP CAP THEREOF

(75) Inventor: Cheng-Chi Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 336 days.

(21) Appl. No.: 12/691,753

(22) Filed: Jan. 22, 2010

(65) Prior Publication Data

US 2011/0177709 A1 Jul. 21, 2011

(30) Foreign Application Priority Data

Jan. 15, 2010 (TW) .............................. 99200809 U

(51) Int. Cl.
*H01R 13/44* (2006.01)
(52) U.S. Cl. ....................................... 439/135; 439/940
(58) Field of Classification Search .................. 439/135, 439/41, 940
See application file for complete search history.

(56) References Cited

U.S. PATENT DOCUMENTS

| | | | |
|---|---|---|---|
| 6,413,111 B1 | 7/2002 | Pickles et al. | |
| 6,945,799 B2 * | 9/2005 | Huang | 439/135 |
| 7,070,428 B2 * | 7/2006 | Ma | 439/135 |
| 7,393,219 B2 * | 7/2008 | Liao | 439/135 |
| 7,883,345 B2 * | 2/2011 | Yeh et al. | 439/135 |
| 2009/0017644 A1 | 1/2009 | Fan et al. | |
| 2010/0029107 A1 | 2/2010 | Yeh et al. | |

FOREIGN PATENT DOCUMENTS

| | | |
|---|---|---|
| CN | 2588584 Y | 11/2003 |
| CN | 2629252 Y | 7/2004 |
| CN | 201199557 | 2/2009 |
| CN | 201210570 Y | 3/2009 |
| TW | M261871 | 4/2005 |

\* cited by examiner

*Primary Examiner* — Hien Vu
(74) *Attorney, Agent, or Firm* — Andrew C. Cheng; Wei Te Chung; Ming Chieh Chang

(57) ABSTRACT

A socket connector includes a socket body, a plurality of contacts received in the socket body; and a pick-up cap mounted upon the socket body. The socket body includes a base and a first sidewall and a second sidewall respectively located by opposite sides of the base. The first sidewall and the second sidewall are respectively formed with a first protrusion and a second protrusion. The pick-up cap includes a cover section and a first flange and a second flange which respectively extend downwardly from opposite sides of the cover section and which are respectively engaged with the first sidewall and the second sidewall of the socket body. The first flange and the second flange are respectively formed with a first notch and a second notch arranged in asymmetrical manner and engaged with the first protrusion and the second protrusion, respectively.

8 Claims, 4 Drawing Sheets

SOCKET CONNECTOR CAPABLE OF PREVENTING MISMATCH OF PICK-UP CAP THEREOF

BACKGROUND OF THE INVENTION

1. Field of the Invention

The present invention relates to a socket connector, and more particularly to a socket connector having a pick-up cap capable of facilitating guaranteed assembly onto a socket body.

2. Description of Prior Art

U.S. patent Publication No. 2009-0017644A1 filed by Fan et al, published on Jan. 15, 2009 has disclosed a socket connector which includes a socket body with a multiplicity of contacts received therein and a pick-up cap mounted upon the socket body. The pick-up cap is employed to engage with an extraction tool to grasp the socket connector so as to achieve fast assembly of the socket connector. Additionally, the pick-up also works as a cover for protecting the contacts in the socket body from damage or pollution.

However, the pick-up cap according to Fan is substantially configured with a symmetrical configuration, and it is ambiguous and difficult to identify and discern the correct orientation of the pick-up when assembled onto the socket body. Consequently, it is likely to damage the pick-up cap or the socket body in the case that the pick-up cap is mistakenly and compulsively mounted upon the socket body in error.

SUMMARY OF THE INVENTION

It is therefore the object of the present invention to provide a socket connector having an improved pick-up cap capable of ensuring accurate assembly onto a socket body.

In accordance with the present invention, a socket connector is provided, which includes a socket body, a plurality of contacts received in the socket body, and a pick-up cap mounted upon the socket body. The socket body includes a base and a first sidewall and a second sidewall respectively located by opposite sides of the base. The first sidewall and the second sidewall are respectively formed with a first protrusion and a second protrusion. The pick-up cap includes a cover section and a first flange and a second flange which respectively extend downwardly from opposite sides of the cover section and which are respectively engaged with the first sidewall and the second sidewall of the socket body. The first flange and the second flange are respectively formed with a first notch and a second notch arranged in asymmetrical manner and engaged with the first protrusion and the second protrusion, respectively.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
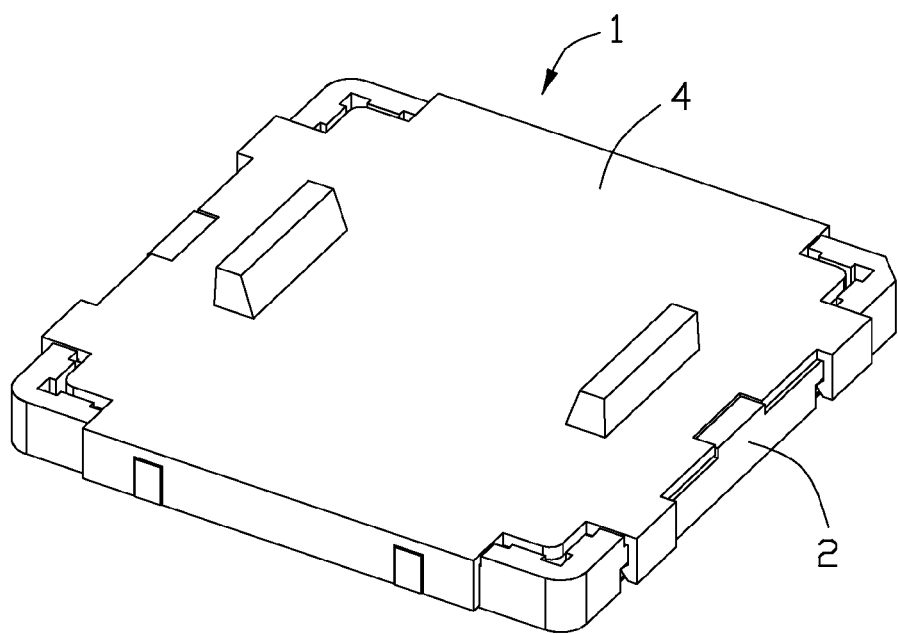
FIG. 1 is an assembled, perspective view of a socket connector in accordance with a preferred embodiment of the present invention.
Figure 2:
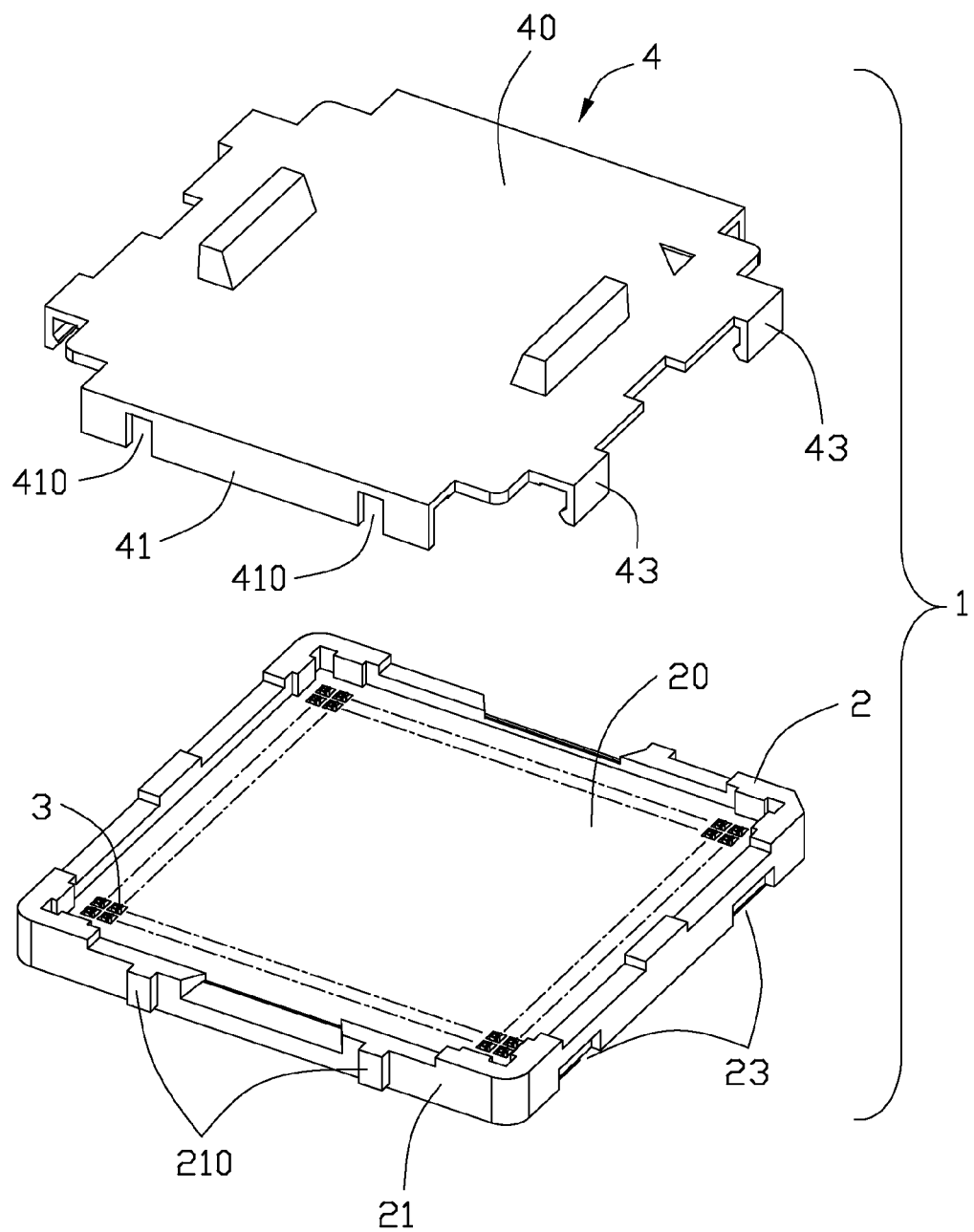
FIG. 2 is an exploded, perspective view of the socket connector in accordance with the preferred embodiment of the present invention.
Figure 3:
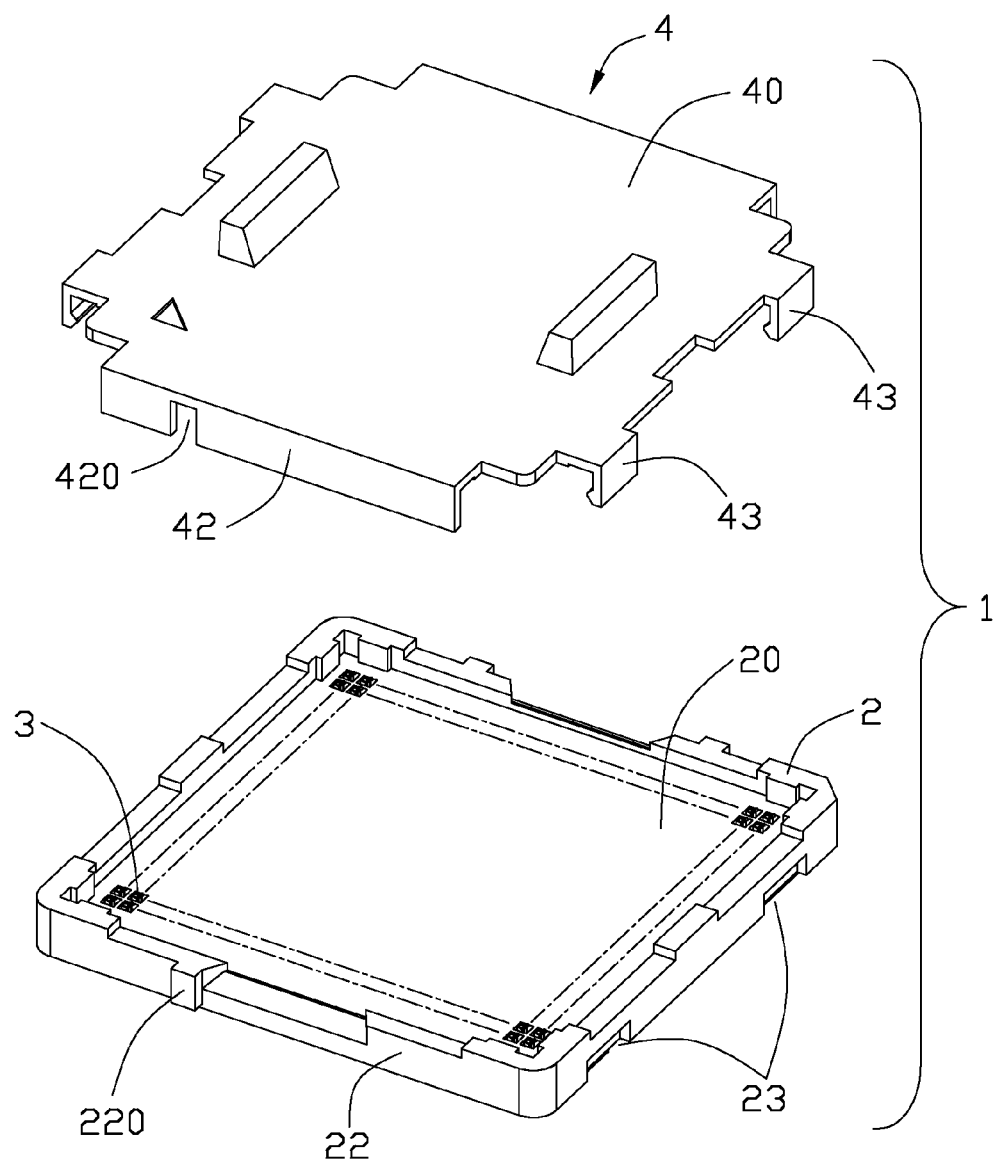
FIG. 3 is another exploded, perspective view of the socket connector, taken from another angle.

The socket connector made in accordance with the present invention is generally used to receive and connect an IC package (not shown) therein. Referring to FIGS. 1-3, the socket connector 1 includes a socket body 2, a plurality of contacts 3 received in the socket body 2, and a pick-up cap 4 mounted upon the socket body 2.

Referring to FIGS. 2 and 3, the socket body 2 includes a rectangular base 20 and four sidewalls located at periphery of the base 20 and extending upwardly therefrom, among which a first sidewall 21 and a second sidewall 22 are configured to be opposite to each other. The first sidewall 21 is formed with two first protrusions 210 extending outwardly therefrom, while the second sidewall 22 is formed with one second protrusion 220 extending outwardly therefrom. Therefore, the first protrusions 210 and the second protrusion 220 are not arranged symmetrically. The other two sidewalls on which there is no protrusion provided are respectively formed with two recesses 23, which are to be engaged with the pick-up cap 4.

The pick-up cap 4 includes a substantially planar cover section 40. A first flange 41 and a second flange 42 respectively extend downwardly from opposite sides of the cover section 40 and are respectively engaged with the first sidewall 21 and the second sidewall 22 of the socket body 2. The first flange 41 is formed with two first notches 410 corresponding to the first protrusions 210 of the socket body 2, while the second flange 42 is formed with only one second notch 220 corresponding to the second protrusion 220. Therefore, the first notches 410 and the second notch 420 are also not arranged in symmetrical manner.

In the case that the pick-up cap 4 is accurately mounted upon the socket body 2, the first flange 41 engages the first sidewall 21 and covers external periphery of the first sidewall 21. The first notches 410 of the pick-up cap 4 are snugly engaged with the first protrusions 210 of the socket body 2, respectively. Simultaneously, the second flange 42 engages the second sidewall 22 and covers outside periphery of the second sidewall 22. The second notch 420 of the pick-up cap 4 is snugly engaged with the second protrusion 220 of the socket body 2.

The pick-up cap 4 additionally has a plurality of hooks 43 provided at a pair of sides thereof where there is no so-called flange formed therefrom. The hooks 43 engage the recesses 23 of the socket body 2 respectively so that the pick-up cap 4 is attached onto the socket body 2.

Figure 4:
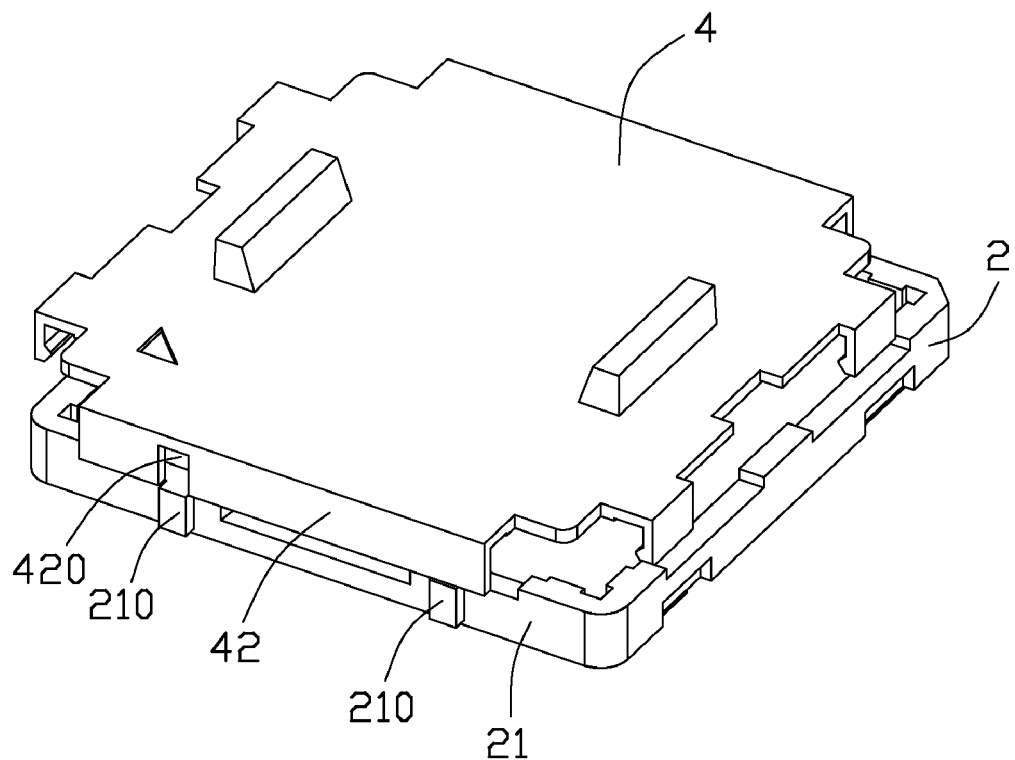
FIG. 4 is a perspective view showing a pick-up cap of the socket connector is mistakenly assembled toward a socket body of the socket connector.

When the pick-up cap 4 is mistakenly assembled toward the socket body 2, as shown in FIG. 4, one of the first protrusion 210 on the first sidewall 21 of the socket body 2 collides with the second flange 42 of the pick-up cap 4 thereby preventing the pick-up cap 4 from further assembly onto the socket body 2. Therefore, because of the asymmetrical configuration of the first protrusions 210 and the second protrusion 220, the first notches 410 and the second notch 420, accurate assembly of the pick-up cap 4 onto the socket body 2 is effectively ensured.

In the previous described preferred embodiment of the present invention, each of the pair of the opposite sides of the pick-up cap is provided with a flange, which achieve fine fool-proofing performance, as well as keeping weight balance of the pick-up cap. Additionally, it is also available that only one side of the pick-up is provided with a flange, even no notch is needed, and a protrusion is set on one sidewall of the socket body. When the pick-up cap is mistakenly assembled, the flange interferingly engages the protrusion and thereby preventing the pick-up cap from being further assembled onto the socket body.

Alternatively, besides the number difference of the protrusion and the notch in the above preferred embodiment, such asymmetrical configuration also could be reached via dimension or position difference of the protrusion or the notch. In a word, all above asymmetrical configurations are able to achieve fool-proofing function.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector, comprising:
a socket body comprising a base and a first sidewall and a second sidewall respectively located by opposite sides of the base, the first sidewall and the second sidewall being respectively formed with a first protrusion and a second protrusion;
a plurality of contacts received in the socket body; and
a pick-up cap mounted upon the socket body and comprising a cover section and a first flange and a second flange which respectively extend downwardly from opposite sides of the cover section, and which are respectively engaged with the first sidewall and the second sidewall of the socket body, the first flange and the second flange being respectively formed with a first notch and a second notch arranged in asymmetrical manner and engaged with the first protrusion and the second protrusion, respectively;
wherein the first sidewall has two said first protrusions and the first flange correspondingly has two said notches, while the second sidewall has only one said second protrusion and the second flange correspondingly has only one said second notch; and
wherein the pick-up has a hook extending downwardly from the cover section and the socket body has a recess engaging the hook such that the pick-up cap is attached onto the socket body.

2. A socket connector, comprising:
a socket body having sidewalls, at least one of which is formed with a protrusion;
a plurality of contacts received in the socket body; and
a pick-up cap comprising a cover section and at least one flange extending downwardly from one edge of the cover section;
wherein when the pick-up cap is mistakenly assembled toward the socket body, the flange collides with the protrusion and thereby preventing the pick-up cap from further assembly onto the socket body;
wherein the pick-up cap has a pair of opposite sides both formed with said flange, respectively;
wherein at least one of the flanges is formed with a notch therein and in the case that the pick-up cap is correctly assembled onto the socket body, the notch is fitly engaged with the protrusion on the socket body; and
wherein one of the flanges is provided with only one said notch, while the other flange is provided with two said notches and said notches arranged in asymmetrical manner.

3. The socket connector as claimed in claim 2, wherein the pick-up has a hook extending downwardly from the cover section and the socket body has a recess engaging the hook such that the pick-up cap is attached onto the socket body.

4. A socket connector comprising:
a flat rectangular insulative housing defining thereof longitudinal and transverse directions perpendicular to each other, and an upward receiving cavity surrounded a plurality of sidewalls including a pair of longitudinal sidewalls and a pair of transverse sidewalls;
at least one recess formed in one of said sidewalls;
a plurality of contacts disposed in the housing and in communication with the receiving cavity upwardly;
a pick up cap assembled upon the housing to cover said receiving cavity, said pick-up cap including a planar top cover section with a plurality of side sections downwardly extending from side edges of said top cover section, at least one latch being formed on one of said side sections to be locked into the recess for securing the pick-up cap to the housing; wherein a protrusion is formed on either one of said sidewalls or one of said side sections, and a notch is formed in the other one of said sidewalls and said side sections to receive said protrusion for polarization consideration;
wherein said protrusion is formed on one of said side walls, and said notch is formed in one of said side sections;
wherein said housing further includes an upward protrusion on a top edge of one of said sidewalls, and the top cover section further includes another notch in one of the side edges to receive said upward protrusion when assembled for alignment consideration and said notches arranged in asymmetrical manner.

5. The socket connector as claimed in claim 4, wherein said protrusion reaches an upper edge of the corresponding side wall.

6. The socket connector as claimed in claim 4, wherein said at least one recess and said protrusion are located at different two of said sidewalls, respectively; said at least one latch and said notch are located at different two of said side sections, respectively.

7. The socket connector as claimed in claim 6, wherein said two different sidewalls include one of said longitudinal sidewalls and one of said transverse sidewalls.

8. The socket connnector as claimed in claim 4, wherein another protrusion is formed on an upper face of the top cover section for facilitating handling of said pick up cap.

\* \* \* \* \*